(12) United States Patent
Mc Auliffe (10) Patent No.: US 7,210,074 B2
(45) Date of Patent: Apr. 24, 2007

(54) BUILT-IN WAVEFORM EDGE DESKEW USING DIGITAL-LOCKED LOOPS AND COINCIDENCE DETECTORS IN AN AUTOMATED TEST EQUIPMENT SYSTEM

(75) Inventor: Robert Edward Mc Auliffe, Loveland, CO (US)

(73) Assignee: Agilent Technologies, Inc, Santa Clara, CA (US)

( * ) Notice: Subject to any disclaimer, the term of this patent is extended or adjusted under 35 U.S.C. 154(b) by 140 days.

(21) Appl. No.: 11/159,790

(22) Filed: Jun. 23, 2005

(65) Prior Publication Data

US 2007/0022350 A1    Jan. 25, 2007

(51) Int. Cl.
*G06K 5/04* (2006.01)
*G01D 18/00* (2006.01)

(52) U.S. Cl. .......... 714/700; 702/85

(58) Field of Classification Search ............ None
See application file for complete search history.

(56) References Cited

U.S. PATENT DOCUMENTS

| 5,298,866 A * | 3/1994 | Kaplinsky ......... 327/261 |
| 6,898,742 B2 * | 5/2005 | Koyanagi et al. |
| 7,054,401 B2 * | 5/2006 | Kada et al. ........ 375/355 |

* cited by examiner

*Primary Examiner*—Christine T. Tu (57) ABSTRACT

Although various embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth herein.

19 Claims, 5 Drawing Sheets

BUILT-IN WAVEFORM EDGE DESKEW USING DIGITAL-LOCKED LOOPS AND COINCIDENCE DETECTORS IN AN AUTOMATED TEST EQUIPMENT SYSTEM

BACKGROUND OF THE INVENTION

1. Field of the Invention

The present invention is directed to automated test equipment (ATE) systems and in particular, to a method, system, and circuitry used to provide digital signal deskew between channels.

2. Background of the Invention

The fundamental operation of an ATE (automatic test equipment) system is to apply stimulus to a device under test (DUT) and capture the response of the DUT to that stimulus. During a digital test, this process consists of applying stimulus vectors—or patterns—to the DUT, waiting for the DUT to produce a stable response to the stimulus, and comparing the response to an expected pattern. Most ATE systems provide a way for the test programmer to control the timing of the response capture with respect to the stimulus. In addition, some ATEs provide the programmer the ability to manually move individual stimulus and response channels with respect to the other channels.

Excessive skew between the various channels of an ATE decreases the maximum pattern (vector) rate of the ATE system. The maximum pattern rate is one factor that can affect device test throughput. The reason the skew between ATE channels has an impact on vector rate can be seen by looking at FIG. 1.

Figure 1:
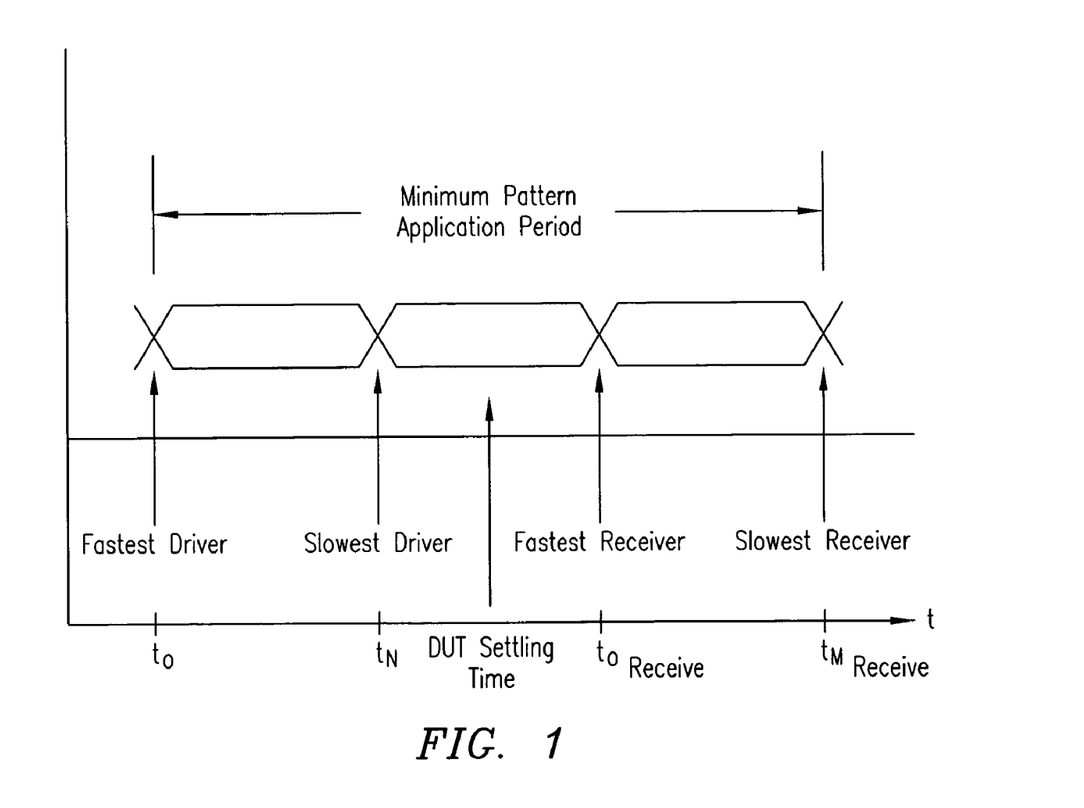
FIG. 1 is a signal timing diagram showing how signal skew for various channels in an ATE impact the minimum pattern application rate of an ATE.

Looking at FIG. 1, the stimulus to the DUT is applied by drivers. Signals arrive at the DUT at different times depending on individual driver speed. Once the signal from the slowest driver arrives, the DUT settling time can begin. The DUT response is captured by receivers in the ATE. Once the slowest receiver has captured the DUT response, the next vector period can begin. The minimum pattern application period (or maximum pattern application rate) is equal to the sum of the driver skew, DUT settling time, and receiver skew. In addition, an ATE system may have other restrictions that increase this minimum period.

The reality and practicality of the situation is that an ATE system may be providing and receiving test patterns and other related signals on thousands of channels connected to a device under test (DUT). Because of physical limitations of the electronic drivers, receivers and signal paths, there is a need to calibrate or deskew the multiple channels on the ATE so that they all are driving at the same moment in time and then also sampling signals from the DUT such that the ATE receives data on channels from the DUT at the same time.

In some cases, in order to test certain aspects of a DUT, it is desirable for a test programmer to intentionally add skew between channels in a controlled fashion. For example, if one ATE channel is supplying a clock to a flip-flop on the DUT and another ATE channel is supplying the data for that flip-flop, the skew between the two channels must be carefully controlled to make sure no setup or hold time specifications are violated. In general, this capability requires very tight control of the skew between ATE channels. Such control of skew cannot be achieved unless the skew of each channel of the ATE has been carefully calibrated to be known or minimal.

During ATE operation, and in order to provide channel-to-channel deskew or controlled skew between channels, most ATE incorporates individual channel or per-pin programmable delay elements. For drive channels, these delay elements are used to move the point in time at which a stimulus is applied to the DUT (hereinafter called the drive edge). For receive channels, similar delay elements control the point in time the DUT response is captured by the ATE (hereinafter the receive edge).

The delay elements used can take many forms, including transmission lines of adjustable length, commercial delay lines (usually consisting of cascaded L/C networks), and chains of logic gates. Any of these implementations will have variations in delay due to temperature, manufacturing process variations, power supply variations, and so forth. Because of these variations, each delay line must be characterized—or calibrated—so that the delays requested by the test programmer can be accurately set by the ATE software. This calibration must typically be repeated when the operating temperature of the system changes.

In the past, one technique used for the calibration of the drive/receive edges and signals was to use a separate instrument, along with the ATE, called a time interval analyzer. A time interval analyzer is basically a device that accurately measures the amount of time that elapses between two signal events. Each channel is routed to the time interval analyzer so that any delay or skew on the channel can be measured with respect to a common reference signal. This technique of calibrating the drive/receive edges of all the channels of an ATE have various disadvantages. One disadvantage is that calibration of the channels must be done in a serial fashion. That is, each channel driver and each channel receiver must be individually measured one after another. Second, a very expensive time interval analyzer is required to achieve the high amount of accuracy desired. Thirdly, the ATE must have a special infrastructure so that each channel (there may be thousands of channels) has a well matched or characterized path to the time interval analyzer so that no additional skew is inadvertently added to any channel.

What is needed is an ATE where the calibration is done for each channel in a parallel manner thereby decreasing calibration time and possible error due to environmental changes (e.g., temperature changes). Furthermore, what is needed is an ATE that does not require an external expensive time interval analyzer instrument to help calibrate the drive and receive edges of the ATE system.

BRIEF SUMMARY OF THE INVENTION

Embodiments of an exemplary ATE provide an ATE system with a plurality of drive channels and a plurality of receive channels. Each one of the drive channels includes an automated calibration and deskew circuit that deskews each drive channel's unique parasitic delay. The calibration circuit uses DLL circuitry to provide multiple clock signals to the calibration circuits that are near perfect in phase.

The calibration circuit further uses a simple coincidence detector, and a controller to provide a delay signal to a programmable delay. The programmable delay is set to calibrate or deskew the drive channel with respect to its own parasitic delay and other drive channels so that they are all driving signals to the DUT at the same time.

Embodiments of the present invention further deskew the receive channels of an exemplary ATE in order to compensate for receive channel parasitic delays and so that the signals being sampled from the DUT are received or latched into the ATE at the same time.

The above summary of the invention is not intended to represent each embodiment or every aspect of the present invention.

BRIEF DESCRIPTION OF THE DRAWINGS

A more complete understanding of the method and apparatus of the present invention may be obtained by reference to the following Detailed Description when taken in conjunction with the accompanying Drawings, wherein.

DETAILED DESCRIPTION OF THE INVENTION

Embodiments of the present invention provide a technique using inexpensive hardware that is incorporated into an ATE system to match and calibrate each channel of an ATE to a specific predetermined delay. The exemplary technique and associated hardware is scaleable so that a plurality of channels can be calibrated simultaneously. This significantly reduces ATE calibration time. ATE calibration time is the time it takes to perform the operation of deskewing, of all the ATE drive and receive channels.

Embodiments of the present invention can calibrate or deskew from 1 to more than ten thousand of ATE channels concurrently or simultaneously without the use of a time interval analyzer.

Referring to FIG. 1, a high level block diagram of an ATE 2 is shown. Such an ATE 2 is designed to aid with the testing of electronic boards, printed circuit boards or integrated circuits. Such printed circuit board or integrated circuits being tested are considered a device-under-test (DUT).

A vector address generator 10 provides an address of a test pattern, typically called vectors or test vectors, to the vector memory 12 upon a vector clock signal 4. Test vectors generally include the drive information or the signals to be applied to the various channels leading to the DUT. The test vectors may also include a signature of the signals expected to be received from the DUT. In this embodiment, the vector address generator 12 provides a vector address to the vector memory 12 at regular intervals as defined by the vector clock 4.

The vector memory 12 stores the vectors that are addressed by the vector address generator 12. The actual vectors may be hundreds or thousands of bits or signals wide. The vector bits from the addressed memory location are provided to the drive/receive logic 14 as essentially two types of signals, being drive signals and expected receive signals. Each of the drive signals or drive data bits and the expected receive data or bits could be many hundreds or thousands of bits wide.

The drive bits generally coincide with the data or signals that are going to be applied to the DUT. The receive bits generally coincide with the data that is expected to be returned from or received from the DUT.

The drive/receive logic 14 runs synchronously with the vector address generator 10 and vector memory 12 in the vector clock 4 domain. The drive/receive logic 14 is also operated with respect to two other clock inputs, the drive clock 6 and the receive clock 8, which will be discussed in more detail with respect to FIG. 3.

The drive/receive logic 14 takes the drive data and essentially provides the drive data to a plurality (N) output drivers 18. The N output drivers provide the output vector to the DUT. The output vector or drive vector is provided at intervals in accordance with the drive clock domain 6. Essentially the drive/receive logic takes drive signals from the vector clock domain 4 and transforms them to the drive clock domain 6 via the drive clock input 15. Delay element D1 16, in this high level diagram implies that the drive clock signal 6 is simply a delayed version of the vector clock signal 4. The delay D1 16 essentially is used to delay all N output drivers by the same amount of time. The amount each of the D1 delays are delayed is generally controllable by the test programmer.

The outputs from the DUT are connected to the plurality (M) input receivers 20. These signals received by the M input receivers 20 are the responses from the DUT to the drive vector signals provided to the DUT by the N output drivers 18. The M input signals are provided from the M input receivers 20 to the Drive/Receive logic block 14 and are captured, latched, or clocked in according to the receive clock 8 signal. The receive clock 8 is essentially a delayed version of the vector clock 4. The delay D2 22 essentially delays the vector clock 4 by an amount of time set by the test programmer.

Referring, for a moment back to FIG. 1, when using an ATE to test a DUT using vectors, test patterns and signals, one would like to be able to apply each test vector and receive each DUT response to the test vector as rapidly as possible, subject to the limitations of the DUT. In reality, it is usually ATE that slows the process or is trying to keep up with the DUT. There are some factors that limit how fast an ATE can apply test vectors to a DUT. Such factors include how fast large vectors can be retrieved from the vector memory 12. There are also other factors, which are explained by referring back to FIG. 1. Starting at the left side of FIG. 1 is the time that a test vector is being provided to the N output drivers 18 and $t_o$, which is the time that the fastest output driver 18 provides the signal to the DUT. All the N output drivers 18 will have varying amounts of delay time due to temperature, signal paths, propagation delays, etc. So after the fastest output driver 18 applies its signal to the device under test, the next fastest, and the next fastest drivers will apply their signals and so on until the Nth or slowest output driver 18 applies its signal at time $t_N$. Thus, at time $t_N$ the ATE has successfully applied all N output signals in a test vector to the DUT.

Then the DUT does whatever it is supposed to do in response to the received input vector during the DUT settling time of FIG. 1. The DUT then outputs M valid signals to the M input receivers 20 of the ATE 2. At time $T_R$ all the DUT outputs are valid and the fastest input receiver 20 receives a bit of the receive data from the DUT. Then one by one the slower receive channels on the ATE receive the receive data from the DUT. Finally, at time $t_M$ the slowest receiver has settled and all the M receive data bits are considered received from the DUT. Furthermore, time $t_M$ represents the earliest time that the next test vector can be set up and sent to the DUT via the N output drivers 18.

The total time from $t_O$ to $t_M$ represents the minimum pattern application period, that is, the minimum elapsed time between providing test vectors to the DUT. Thus, one can realize from this FIG. 1, that if the difference in time between the fastest, $t_O$, and the slowest, $t_N$, driver 18 and if the difference in time between the fastest, $t_R$, and the slowest, $t_M$, can be reduced, then the overall vector application period can also be reduced. A reduction in the vector application period will decrease the time required by an ATE to test a DUT.

Embodiments of the present invention decrease the ($t_N$-$t_O$) and ($t_M$-$t_R$) by minimizing the skew between the N output channels and the skew between the M receive channels. Thus, the entire minimum pattern application period is decreased.

Figure 2:
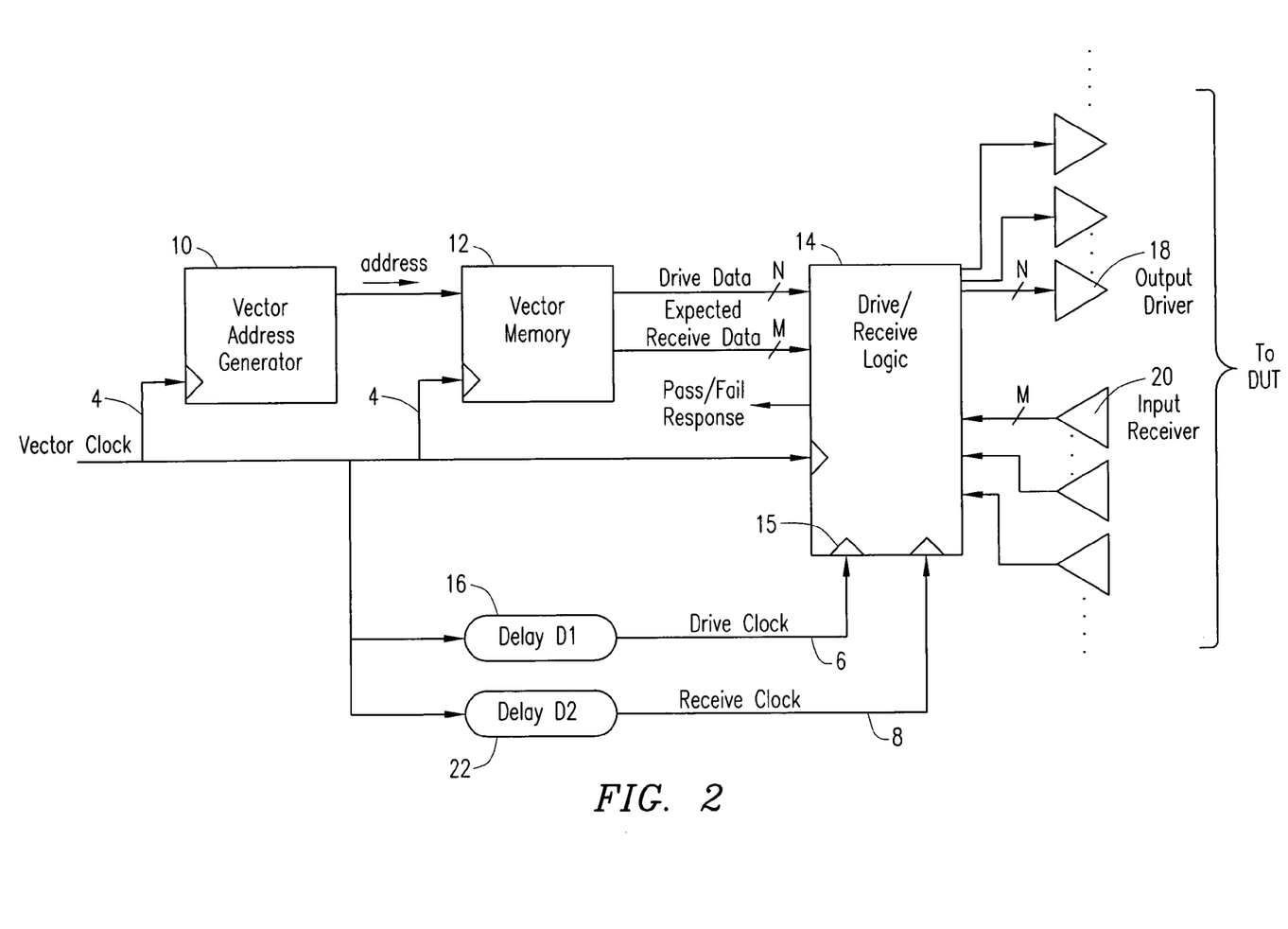
FIG. 2 is a is a high level block diagram of an ATE having a plurality of output and receive channels.
Figure 3:
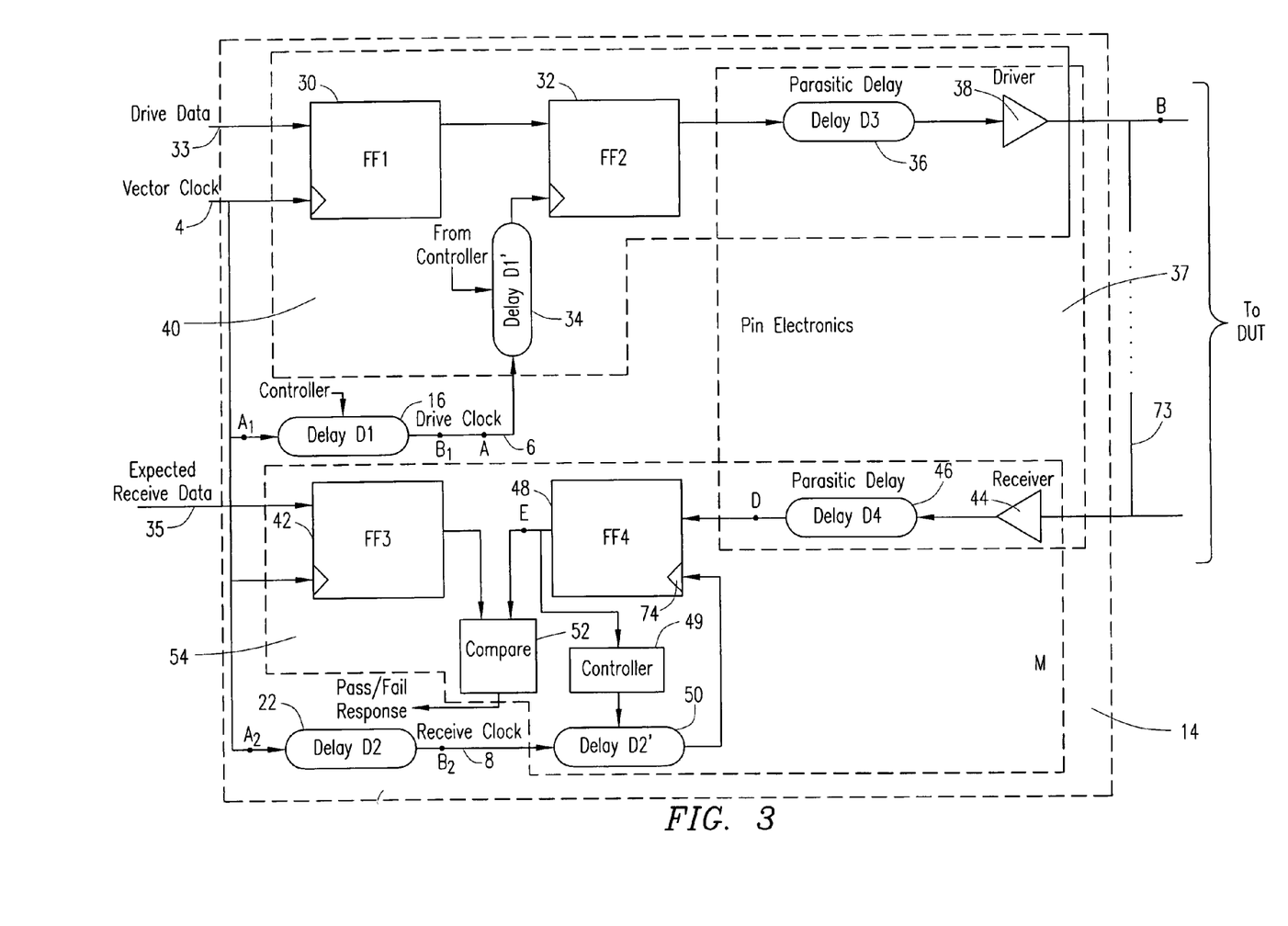
FIG. 3 is a block diagram of an exemplary drive/receive logic block.

FIG. 3 depicts a high-level block diagram of the drive/receive logic block 14 of FIG. 2. It is understood that the output drivers, input receivers and other electronics associated with each channel are made of electronic materials that are not exactly identical. The minuscule timing differences and unique delays associated with each channel are commonly referred to as parasitic delays. Such parasitic delays cause the timing differences between the altering of the first output driver 18 with valid data at time $t_O$ and the availability of valid data on the Nth channel output driver at time $t_N$.

The top portion of FIG. 3 generally depicts one of the N output channels in the drive portion of the drive/receive logic block 14. The bottom portion of FIG. 3 generally depicts one of the M receiver channels in the drive/receive logic block 14. The right portion of FIG. 3 depicts a portion of the drive/receive logic 14 called the pin electronics 37. The pin electronics 37 portion is the part of an ATE that takes generic digital signals and transforms them into signals appropriate for the type of technology and device that is being tested. The pin electronics 37 might adjust amplitude or edge speed on the digital signal.

Looking at one of the N output channels 40, a bit of a test vector is provided to the flip-flop 30 on the drive line 33. There is a flip-flop 30 for each drive channel 40 on the ATE 3. The bit of the test vector is clocked into flip-flop 30 (FF1) in the vector clock domain 4.

There are two delay circuits in each of the drive channels. One of the delays D1 16 is discussed above. The additional delay labeled delay D1' 34 is also found in each drive channel and is controlled and adjusted so that it can clock and in effect drive the output signal with respect to the other channels. The delay D1' 34 is adjusted as a result of calibration and deskew process (described below) in order to help deskew the outputs of all the drive channels 40 in the ATE 3.

For each drive channel, flip-flop 2 (FF2) 32 receives the drive channel's vector bit from FF1 30 and provides the bit to the output driver 38 in the drive clock domain 6, which is adjusted for deskew by delay D1' 34. Delay D3 36 is intended to represent the parasitic delay (pin electronics delay) associated with the output driver 38. The parasitic delay D3 36 is not a controllable delay, but is instead a natural consequence of variations in the electronics in the physical circuitry. The main purpose of all the delay D1''s found in each drive channel of the ATE is to "dial out" the faster drive channels and slow them down so that each drive channel has an overall delay that is closer to the overall delay of the slowest drive channel.

With respect to the receive channel 54, which is one of the plurality of receive channels in an exemplary ATE 3, an expected receive data bit is provided to the receive channel 54 on the expected receive data line 35 in the vector clock domain 4. The expected receive bit is for comparison with the data bit that will be received from the DUT.

One of the M input receivers 44 receives a bit of data from the DUT. Since the input receiver is part of the pin electronics 37, it is receiving the bit or data signal from the DUT and converting the received bit to a signal or bit that can be used by the digital technology in the exemplary ATE 3. The process of converting the received bit at the receiver 44 creates some parasitic delay that is depicted as delay D4 46. The parasitic delay 46 of each receive channel 54 of the ATE will vary. The consequence is that signals provided by the DUT at exactly the same moment in time will arrive at flip-flop 4 (FF4) 48 in each channel at slightly different times with respect to one another.

To compensate for the varying arrival times of the received signals, the receive clock domain 8 is tuned or skewed by delay element delay D2' 50. Each receive channel has its own delay D2' that is a programmable or controllable delay so that the parasitic receive delay 46 of the receive channel can be accounted for.

At the compare block 52, the expected data from FF3 42 and the actual received data from the DUT are compared. Based on the comparison, a pass or fail response is provided to the higher level control circuitry and software of the ATE (not shown).

To summarize what an embodiment of the present invention does is to use delay D1' for the drive channel and delay D2' for the receive channel to account for or "dial out" the parasitic and varying delays of parasitic drive delay 36 and parasitic receive delay 46 in each drive and receive channel. This will result in deskewing of the drive channel outputs and receive channel receivers.

Stated another way, an exemplary embodiment of the present invention operates to do three things. One is to minimize the skew between all the N output drivers of the ATE, which is done by adjusting the drive clock deskew delays 34 (delay D1'). The second is to minimize the skews of all the receive channels in the ATE so that all the M receive channels capture data from the DUT at essentially the same time, which is done by adjusting the receive clock deskew delays 50 (delay D2') in each receive channel.

The third thing that an exemplary embodiment operates to do is to find the zero receive point. A zero receive point occurs at the point in time that the ATE has provided a clock cycle's drive vector data and is ready to receive responses there to from the DUT. Referring briefly to FIG. 1, the zero receive point is at time $t_N$. The reason the zero receive point needs to be determined is to provide the test programmer a specific point in time to wait from while the DUT settles before receiving data back from the DUT. For example, if the settling time of the DUT is 20 nano seconds, then the receive channels of the ATE must be able to reliably delay 20 nano seconds from the zero receive point, $t_N$, before attempting to clock or latch in any data in the receive channels from the DUT. The zero receive point provides a point in time from which to delay the receive channels.

Figure 4A:
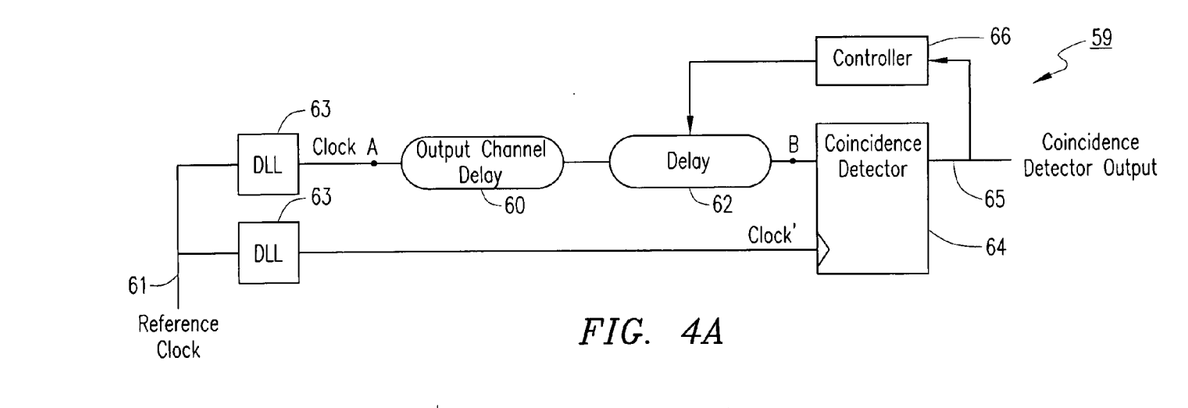
FIG. 4A is a block diagram of a calibration circuit in accordance with an embodiment of the invention.

FIG. 4A provides a block diagram of the circuitry used in an exemplary embodiment to make the time interval measurements used to set the deskew drive and receive channel delays 34 and 50. Unlike prior art techniques that require a time interval analyzer, embodiments of the present invention use circuitry within the ATE. Such circuitry operates more like a time interval matcher because it matches a time period rather than measures a time interval.

Figure 4B:
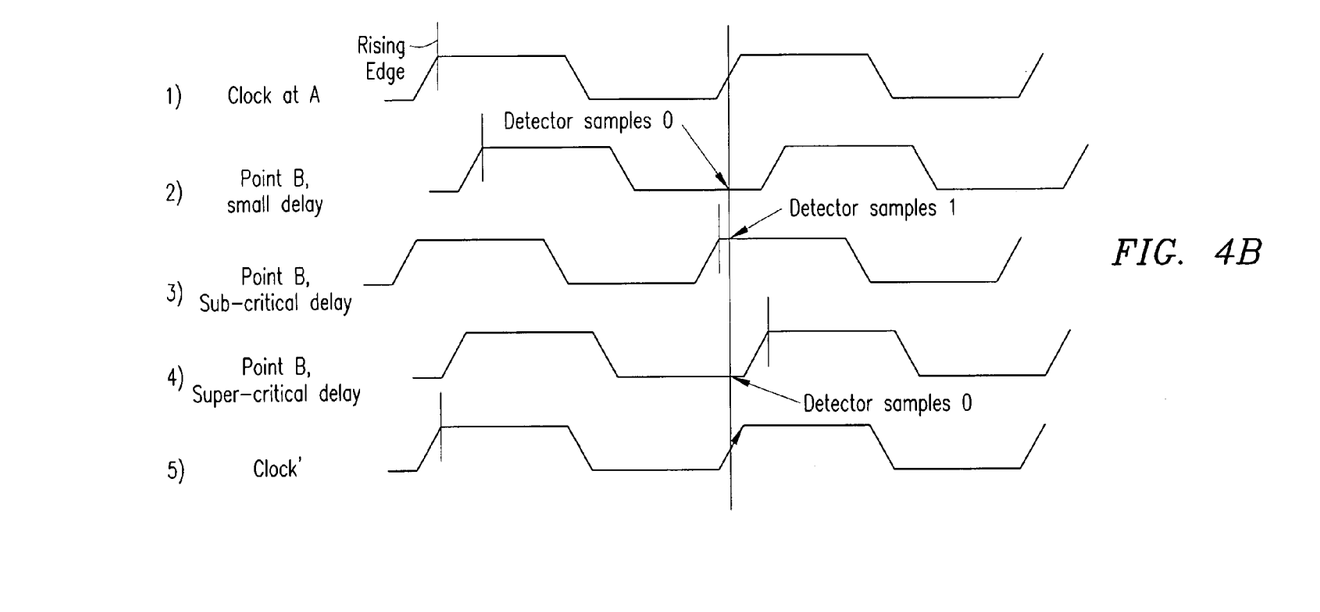
FIG. 4B is a timing diagram used to explain the working of an exemplary calibration circuit.

The way the time interval matcher generally operates is depicted in FIGS. 4A and 4B. FIG. 4A depicts a time interval matcher with coincidence detection 59 in accordance with an embodiment of the invention. The exemplary time interval matcher with coincidence detection (TIMWCD) circuit 59 is used in several places in the ATE to help perform the deskew algorithm that deskews the various drive and receive channels of the ATE. Each drive channel TIMWCD circuit 59 receives a reference clock 61. The reference clock 61 is calibrated by a digital lock loop (DLL) circuit 63 such that the reference clock signal is synchronized and in phase at each and every channel location on the ATE. In each drive channel the synchronized clock input, which is output from a DLL circuit 63, goes through two delays, one being the physical individual output channel delay 60 (which coincides with delay elements D1 16 and D3 36 in FIG. 3), and the second delay 62. The delay 62 is an adjustable delay element. A coincidence detector 64, which is basically a D-flip-flop, receives signal B and clock prime. The coincidence detector 64, when being clocked by clock prime detects the phase of signal B by providing either a low or high output 65.

The controller 66 receives the coincidence detector output 65 and provides feedback to the programmable delay element 62 so that it can be adjusted to deskew the various drive channels. The operation of this circuit and concept is straight forward. If the clock, of a known period at point A and clock prime have an identical phase relationship based on the DLL circuits 63, then the controller 66 can easily adjust the programmable delay element 62 so that the delay between point A and point B is exactly matched to one clock period interval.

Referring to FIG. 4B, there are shown a set of timing waveforms to help explain the workings of an embodiment of the invention. Clock A represents the clock of a known period provided by the DLL circuit at point A in FIG. 4A. Clock A is the common clock for each of the drive or output channels.

The next waveform is what the waveform at point B would look like if the combination of the drive channel delay 60 and the programmable delay 62 were relatively small compared to the clock A period.

The third waveform, labeled point B, sub-critical delay, also shows a clock waveform at point B after the controller 66 signaled the programmable delay 62 to insert more delay into the clock signal until the delayed clock signal at point B is sub-critical or the clock signal is delayed just less than one cycle from the clock signal at point A. In this sub-critical delay the coincidence detector 64 samples a high or "1" input and outputs a high "1" output at coincidence detector output 65.

At waveform 4, labeled point B, super-critical delay, the clock signal at point B is delayed a little bit more than one clock cycle with respect to the clock signal at point A. Here the coincidence detector 64 samples a zero, "0" and outputs a zero "0" to controller 66.

Waveform 5 is the clock prime signal that is input into the clock input of the coincidence detector 66. Clock prime and the clock waveform at point A are each exactly in phase with each other so that the rising edge of the clock signal at point A coincides with the rising edge of the clock prime waveform.

An exemplary algorithm for each controller 66 in each drive channel is started by setting the programmable delay 62 to a minimum value, which provides a waveform roughly similar to the second waveform shown in FIG. 4B, wherein a zero is being output from the coincidence detector 64. While the controller 66 is receiving a zero from the coincidence detector 64, the controller will increase the delay of the programmable delay 62 in an incremental fashion. The controller will continue to increase the amount of delay and in doing so will begin to receive a one from the coincidence detector 64 for a while after the delay at point B is halfway through the clock cycle. The controller continues to incrementally increase the delay of the programmable delay 62 until it receives a zero again from the coincidence detector 64. At this point the controller 66 stops changing the delay of the programmable delay 62.

Each drive channel programmable delay 34 (See FIG. 3) is adjusted this way using points A and B as shown in FIG. 3. As a result, each drive channel's skew is adjusted so that all the drive channels are deskewed. The adjustment and calibration of the plurality of drive channels is done concurrently. When each controller 66 in each drive channel is finished, the higher level software of the ATE is provided the information, data, or amount of delay to program each delay D1' 34 to have the delay between point A and B to be exactly one clock period.

By setting the amount of programmable delay required to delay the programmable delay element D1' 34 for each drive channel to match one clock cycle delay, then a plurality of drive channels can be set to provide an output signal from their drive channel output 38 synchronously. As such, an exemplary ATE utilizes the calibration circuit of FIG. 4A to calibrate and deskew a plurality of drive channels in a parallel fashion or during the same time period.

Furthermore, calibration circuitry, which incorporates DLL clock synchronization, of FIG. 4A is also used to calibrate delay D1 16 between points $A_1$ and $B_1$ in FIG. 3, in order to set the proper amount of delay to calibrate the entire output channel the amount of delay time that the programmer has programmed. The overall goal being to calibrate all the drive channels to the slowest drive channel $t_N$ as discussed with respect to FIG. 1.

Figure 5:
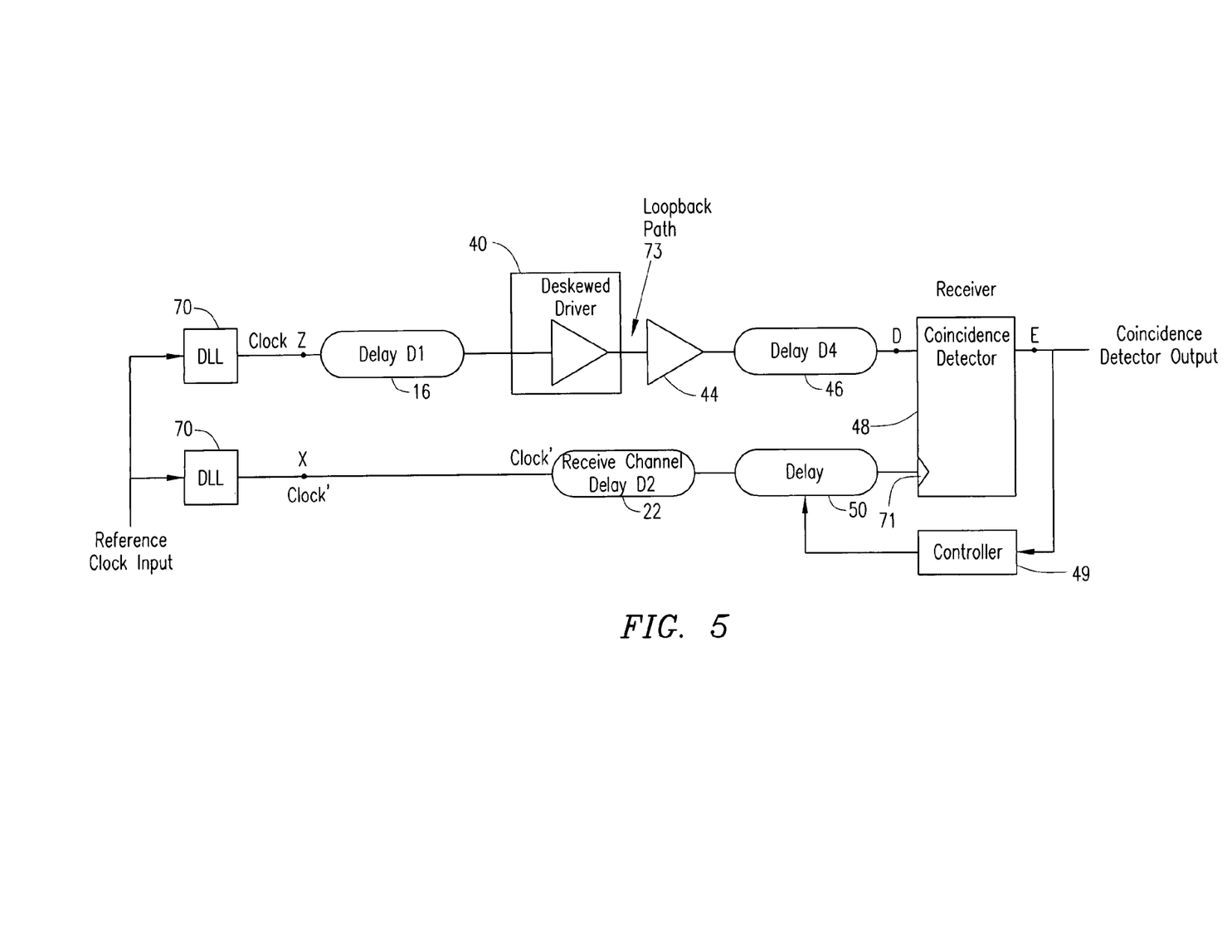
FIG. 5 is a block diagram of an exemplary calibration circuit used in a receive channel of an exemplary ATE.

In order to calibrate the receive channels, we now look at FIG. 5. Here each deskewed drive channel 40 is "looped back" or connected to a receive channel 44. Another exemplary technique would be to use the output of one deskewed drive channel along with the use of DLL circuitry to provide its output to each receive channel receiver 44 so that each receive channel receives a truly synchronous signal from a deskewed drive channel. Yet another technique would be to provide a known in phase test signal to each receive channel receiver 44.

DLL circuits 70 are provided in FIG. 5 to guarantee that the clock and clock prime waveforms are synchronous and have the same phase relationship. It should be understood that DLL circuitry is well known in the industry and can be inexpensively provided in semiconductor circuitry used in an ATE. The various DLL circuits can be physically separated by distance on a printed circuit board or be located in separate integrated circuits. Regardless of the DLL circuits' locations they can be used to provide the matched reference signal (clock signal in this case) to various locations or calibration circuits within an exemplary ATE.

In FIG. 5, exemplary calibration circuitry is being used to calibrate and deskew the receive channels 54. In essence, the coincidence detector 48 and controller 49 are adjusting the programmable delay 50 so that the delay from the point Z clock signal through the deskewed driver channel 40 to the input of the coincidence detector 48 at point D is the same as the delay from the point X, clock prime, to the clock input 71 of the coincidence detector 48.

Referring to FIG. 3, one can see one example of how the exemplary calibration circuit can be connected to calibrate each receive channel so that data at the same moment in time and also to determine the timing of the zero receive point, $t_{0\ Receive}$. FIG. 3 coincides with FIG. 5 in that the elements of FIG. 5 can be mapped to FIG. 3. For example, the coincidence detector can be element 48 (FF4). The two paths that are having their delays matched are (1) from point $A_1$ (clock)

in FIG. 3 through delay D1 16, delay D1' 34, FF2 32, parasitic delay 36, output driver 38, loop back 73, receiver 44, parasitic delay 46; and (2) delay D2 22, delay D2' 50, into the clock input 74 of the coincidence detector 48.

Since the drive channel has already been deskewed to an accuracy of plus or minus 3 nano seconds with respect to the clock signal, then the receive channel 54 will be aligned with all the other receive channels with an accuracy of about plus or minus 6 nano seconds with respect to the clock signal. The output of output channel 38 will occur at time $t_N$. Using this configuration the controller 49 is used to adjust programmable delay 50 so that the two paths take an equal amount of time for each receive channel.

After the receive channel is calibrated with respect to the zero receive point, then another calibration circuit (not specifically shown) can be used to calibrate all the Delay D2 22 elements in each receive channel. The deskew of the receive channel is performed in a similar fashion as discussed with respect to FIG. 4B and the delays in the drive channel, with the exception that only a rising edge needs to be inserted at clock and clock prime points. The controller 49 looks for the first time one is detected by the coincidence detector 48 and then stops incrementing the amount of delay time on delay 50.

In essence, this process of calibrating the receive channels requires looping back output data from the deskewed receive channels as if the output data were going through the DUT without any delay. Meanwhile providing a clock signal, which clocks the input data to the receive channels while adjusting the delay in the clock signal path so that the output data is being captured by each receive channel at exactly the time that the DUT would be transitioning, $t_{0RECEIVE}$.

As such embodiments of the present invention provide an ATE, wherein each drive channel of an ATE are calibrated concurrently and at the same time. Furthermore, each receive channel of an ATE can be simultaneously and concurrently calibrated. The calibration is done without the use of prior time interval analyzers, but instead with inexpensive circuitry embedded and easily designed into the circuitry of the ATE. Such circuitry includes simple DLL circuits, and flip-flops. Such circuits can be easily found or created in the extra gates of a programmable gate array commonly used in the design and construction of an ATE. Thus, the physical size of the ATE does not change due to the additional calibration circuitry provided by an exemplary embodiment of the invention.

Calibrations, deskew and alignment of hundreds or even ten thousand drive and receive channels of an ATE can be accomplished using embodiments of the present invention in less than 10 seconds.

The previous description is of preferred embodiments for implementing the invention, and the scope of the invention should not necessarily be limited by these descriptions. The scope of the present invention is instead defined by the following claims.

The invention claimed is:

1. An automated test equipment (ATE) that tests digital devices, said ATE comprising:
    a plurality of drive channels, each drive channel provides a bit of a data vector to a device under test (DUT) at a first predetermined time period;
    a plurality of receive channels, each receive channel latches in a receive bit of data from said DUT at a second predetermined time period, said second predetermined time period starting at a zero receive point;
    each one of said plurality of drive channels further comprises a first drive channel calibration circuit that adjusts a first drive channel programmable delay, in each drive channel, to deskew the plurality of drive channels with respect to a parasitic delay associated with each drive channel, so that each drive channel provides said bit of said data vector to said DUT during said first predetermined time period; and
    each one of said plurality of receive channels further comprises a first receive channel calibration circuit that adjusts a first receive channel programmable delay, in each receive channel, to deskew the plurality of receive channels with respect to a parasitic delay associated with each receive channel, so that each receive channel is calibrated to latch in said receive bit just after said zero receive point and within said second predetermined time period.

2. The ATE of claim 1, wherein said plurality of drive channels, each comprising said first drive channel calibration circuit, deskew said plurality of drive channels concurrently.

3. The ATE of claim 1, wherein said plurality of receive channels, each comprising a first receive channel calibration circuit, deskew the plurality of receive channels concurrently.

4. The ATE of claim 1, wherein said first drive channel calibration circuit comprises:
    a first DLL circuit providing a first clock signal to an output portion of the drive channel, said output portion of said drive channel providing a parasitic delayed signal;
    a second DLL circuit providing a second clock signal, said second clock signal being in phase with said first clock signal;
    a coincidence detector that receives said parasitic delayed signal after it is further delayed by said first drive channel programmable delay, said coincidence detector further receives said second clock signal; and
    a controller that receives the output of said coincidence detector and provides a delay signal to said first drive channel programmable delay to delay said parasitic delayed signal by an amount determined by said controller.

5. The ATE of claim 1, wherein said plurality of drive channels are calibrated by said first drive channel calibration circuits before said plurality of receive channels are calibrated by said first receive channel calibration circuits.

6. The ATE of claim 1, wherein each of said first drive channel calibration circuits further comprises DLL circuitry to provide two in-phase clock signals to each first channel calibration circuit.

7. The ATE of claim 1, wherein each of said first receive channel calibration circuits further comprises DLL circuitry that provides at least two in-phase clock signals to each first receive channel calibration circuits.

8. A method of calibrating an ATE comprising:
    deskewing a plurality of drive channels of said ATE concurrently so that said plurality of drive channels each provide a bit of a data vector to a device-under-test (DUT) at the same time and at a time that is about at the same time as a slowest one of said plurality of drive channels; and
    deskewing a plurality of receive channels of said ATE concurrently and after said deskewing said plurality of drive channels.

9. The method of claim 8, wherein said deskewing said plurality of receive channels of said ATE comprises concurrently determining the zero receive point of each of one of said plurality of said receive channels.

10. The method of claim 8, wherein said step of deskewing said plurality of drive channels concurrently comprises driving each said drive channel with a plurality of clock signals that are exactly in phase and adjusting a programmable delay in each one of said plurality of drive channels to deskew a parasitic delay found in each one of said plurality of drive channels in a concurrent manner.

11. The method of claim 10, wherein at least one DLL circuit is used to provide said plurality of clock signals.

12. The method of claim 8, wherein said deskewing said plurality of receive channels of said ATE concurrently includes looping back an output of at least one drive channel to an input of said plurality of receive channels.

13. A ATE comprising:
   a plurality of drive channels for providing test vectors to a DUT;
   a plurality of receive channels for receiving expected responses from said DUT;
   means for concurrently deskewing said plurality of drive channels, said means for concurrently deskewing said plurality of drive channels comprising a first calibration circuit concurrently adjusting a first programmable delay in each one of said plurality of drive channels to deskew the parasitic delay of each drive channel to be aligned as closely as possible with one of said plurality of drive channels that has the most parasitic delay.

14. The ATE of claim 13, wherein, said means for concurrently deskewing said plurality of drive channels further comprises a second calibration circuit concurrently adjusting a second programmable delay in each one of said plurality of drive channels in order to delay a drive signal in each one of said plurality of drive channels so that said drive signal is aligned as closely as possible.

15. The ATE of claim 13, further comprising means for concurrently deskewing said plurality of receive channels.

16. The ATE of claim 15, wherein said means for concurrently deskewing said plurality of receive channels comprises a loop-back connection from an output of at least one drive channel output to an input of said plurality of receive channels.

17. The ATE of claim 15, wherein said means for concurrently deskewing said plurality of receive channels comprises a third calibration circuit concurrently adjusting a third programmable delay in each one of said plurality of receive channels to deskew the parasitic delay of each receive channel to be aligned as closely as possible to a zero receive point.

18. The ATE of claim 15, wherein said means for concurrently deskewing said plurality of drive channels and said means for concurrently deskewing said plurality of receive channels completes an ATE deskew and calibration function in less than 10 seconds wherein said plurality of drive channels and said plurality of receive channels total to less than ten thousand channels.

19. The ATE of claim 13, wherein each said first calibration circuit comprises:
   at least one DLL circuit providing two signals that at are in phase;
   said first programmable delay;
   a coincidence detector, said coincidence detector and said first programmable delay each receiving one of said two signals that are in phase; and
   a controller, receiving an output from said coincidence detector and providing a delay signal to said programmable delay.

* * * * *

UNITED STATES PATENT AND TRADEMARK OFFICE
CERTIFICATE OF CORRECTION

| | | |
|---|---|---|
| PATENT NO. | : 7,210,074 B2 | Page 1 of 1 |
| APPLICATION NO. | : 11/159790 | |
| DATED | : April 24, 2007 | |
| INVENTOR(S) | : Mc Auliffe | |

It is certified that error appears in the above-identified patent and that said Letters Patent is hereby corrected as shown below:

On the Title page, in field (56), under "U.S. Patent Documents", in column 2, line 2, after "Koyanagi et al." insert -- 714/700 --.

In column 12, line 24, in Claim 19, after "that" delete "at".

Signed and Sealed this

Twenty-first Day of August, 2007

JON W. DUDAS
*Director of the United States Patent and Trademark Office*